United States Patent
Grunow et al.

(10) Patent No.: US 7,833,893 B2
(45) Date of Patent: Nov. 16, 2010

(54) METHOD FOR FORMING CONDUCTIVE STRUCTURES

(75) Inventors: Stephan Grunow, Wappingers Falls, NY (US); Kaushik A. Kumar, Beacon, NY (US); Kevin Shawn Petrarca, Newburgh, NY (US); Richard Paul Volant, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 695 days.

(21) Appl. No.: 11/775,257

(22) Filed: Jul. 10, 2007

(65) Prior Publication Data

US 2009/0017616 A1  Jan. 15, 2009

(51) Int. Cl.
*H01L 21/44* (2006.01)

(52) U.S. Cl. ................. 438/597; 438/618; 438/622; 438/687; 438/629; 438/672; 257/E21.545; 257/E21.546

(58) Field of Classification Search ............... 438/597
See application file for complete search history.

(56) References Cited

U.S. PATENT DOCUMENTS

| | | | | |
|---|---|---|---|---|
| 4,666,556 A * | 5/1987 | Fulton et al. | ................ | 438/431 |
| 5,008,216 A * | 4/1991 | Huang et al. | ................ | 438/656 |
| 5,047,815 A * | 9/1991 | Yasuhira et al. | ............. | 257/303 |
| 5,223,447 A * | 6/1993 | Lee et al. | ..................... | 438/247 |
| 5,665,202 A * | 9/1997 | Subramanian et al. | ...... | 438/692 |
| 5,786,263 A * | 7/1998 | Perera | ........................ | 438/431 |
| 5,963,828 A * | 10/1999 | Allman et al. | ............. | 438/648 |
| 6,051,880 A * | 4/2000 | Kikuta | ....................... | 257/751 |
| 6,093,966 A * | 7/2000 | Venkatraman et al. | ...... | 257/751 |
| 6,117,782 A * | 9/2000 | Lukanc et al. | ............. | 438/692 |
| 6,140,223 A * | 10/2000 | Kim et al. | .................... | 438/629 |
| 6,251,528 B1 * | 6/2001 | Uzoh et al. | ................ | 428/587 |
| 6,251,753 B1 * | 6/2001 | Yeh et al. | .................... | 438/445 |
| 6,258,692 B1 * | 7/2001 | Chu et al. | ................... | 438/400 |
| 6,291,332 B1 * | 9/2001 | Yu et al. | ..................... | 438/618 |
| 6,368,484 B1 | 4/2002 | Volant et al. | | |
| 6,429,134 B1 * | 8/2002 | Kubota et al. | .............. | 438/692 |
| 6,486,055 B1 * | 11/2002 | Jung et al. | .................. | 438/618 |
| 6,486,057 B1 * | 11/2002 | Yeh et al. | .................... | 438/633 |
| 6,534,378 B1 * | 3/2003 | Ramkumar et al. | ......... | 438/401 |
| 6,573,601 B2 * | 6/2003 | Dennison et al. | ........... | 257/752 |
| 6,677,232 B2 * | 1/2004 | Hong et al. | ................. | 438/627 |
| 6,720,232 B1 * | 4/2004 | Tu et al. | ..................... | 438/396 |
| 6,812,144 B2 * | 11/2004 | Shim | .......................... | 438/652 |

(Continued)

*Primary Examiner*—Fernando L Toledo
*Assistant Examiner*—Ankush K Singal
(74) *Attorney, Agent, or Firm*—Schmeiser, Olsen & Watts; Wenjie Li

(57) ABSTRACT

A method of forming a method a conductive wire. The method includes forming a dielectric hardmask layer on a dielectric layer; forming an electrically conductive hardmask layer on the dielectric hardmask layer; forming a trench extending through the conductive and dielectric hardmask layers into the dielectric layer; depositing a liner/seed layer on the conductive hardmask layer and the sidewalls and bottom of the trench; filling the trench with a fill material; removing the liner/seed layer from the top surface of the conductive hardmask layer; removing the fill material from the trench; electroplating a metal layer onto exposed surfaces of the conductive hardmask layer and liner/seed layer; and removing the metal layer and the conductive hardmask layer from the dielectric hardmask layer so the metal layer and edges of the liner/seed layer are coplanar with the top surface of the dielectric hardmask layer.

20 Claims, 3 Drawing Sheets

U.S. PATENT DOCUMENTS

| | | | |
|---|---|---|---|
| 6,818,552 B2 * | 11/2004 | Daniels et al. | 438/638 |
| 6,825,561 B1 * | 11/2004 | Agarwala et al. | 257/752 |
| 6,831,310 B1 * | 12/2004 | Mathew et al. | 257/270 |
| 6,897,508 B2 * | 5/2005 | Sneh | 257/301 |
| 6,914,316 B2 * | 7/2005 | Yun et al. | 257/506 |
| 6,927,138 B2 * | 8/2005 | Takenaka | 438/294 |
| 7,091,133 B2 * | 8/2006 | Goundar et al. | 438/758 |
| 7,138,337 B2 * | 11/2006 | Lin | 438/685 |
| 7,176,123 B2 * | 2/2007 | Kim et al. | 438/637 |
| 7,282,447 B2 * | 10/2007 | Dennison et al. | 438/689 |
| 7,312,131 B2 * | 12/2007 | Wu | 438/397 |
| 7,332,396 B2 * | 2/2008 | Lin et al. | 438/259 |
| 7,387,943 B2 * | 6/2008 | Kim et al. | 438/437 |
| 7,416,987 B2 * | 8/2008 | Hieda et al. | 438/700 |
| 7,442,979 B2 * | 10/2008 | Shea | 257/298 |
| 7,504,725 B2 * | 3/2009 | Kim et al. | 257/751 |
| 2001/0014525 A1 * | 8/2001 | Ireland | 438/618 |
| 2001/0027019 A1 * | 10/2001 | Ishii et al. | 438/690 |
| 2002/0135040 A1 * | 9/2002 | Li et al. | 257/508 |
| 2003/0143322 A1 * | 7/2003 | Ning | 427/79 |
| 2003/0166345 A1 * | 9/2003 | Chang | 438/717 |
| 2004/0036051 A1 * | 2/2004 | Sneh | 251/301 |
| 2004/0212086 A1 * | 10/2004 | Dotta et al. | 257/737 |
| 2005/0020090 A1 * | 1/2005 | Dennison et al. | 438/736 |
| 2005/0153538 A1 * | 7/2005 | Tsai et al. | 438/636 |
| 2005/0170661 A1 * | 8/2005 | Economikos et al. | 438/759 |
| 2006/0063375 A1 * | 3/2006 | Sun et al. | 438/629 |
| 2006/0088977 A1 * | 4/2006 | Yang | 438/424 |
| 2006/0192266 A1 * | 8/2006 | Willer et al. | 257/510 |
| 2006/0234443 A1 * | 10/2006 | Yang et al. | 438/253 |
| 2006/0276041 A1 * | 12/2006 | Uchikura et al. | 438/692 |
| 2007/0004190 A1 * | 1/2007 | Dambrauskas et al. | 438/613 |
| 2007/0059915 A1 * | 3/2007 | Akram | 438/597 |
| 2007/0077720 A1 * | 4/2007 | Heineck et al. | 438/372 |
| 2007/0155119 A1 * | 7/2007 | Muemmler et al. | 438/424 |
| 2007/0164443 A1 * | 7/2007 | Florian et al. | 257/774 |
| 2007/0190742 A1 * | 8/2007 | Chou et al. | 438/424 |
| 2007/0249129 A1 * | 10/2007 | Hall et al. | 438/296 |
| 2007/0281487 A1 * | 12/2007 | Dennison et al. | 438/700 |
| 2008/0020503 A1 * | 1/2008 | Sheats et al. | 438/34 |
| 2008/0253097 A1 * | 10/2008 | Kawano | 361/766 |
| 2008/0283960 A1 * | 11/2008 | Lerner | 257/508 |

* cited by examiner

METHOD FOR FORMING CONDUCTIVE STRUCTURES

FIELD OF THE INVENTION

The present invention relates to the field of integrated circuit fabrication; more specifically, it relates to a method of making electrically conductive plated interconnect structures for integrated circuits.

BACKGROUND OF THE INVENTION

Modern integrated circuits are comprised of devices such as transistors formed in a semiconductor layer and electrically conductive wires formed in inter-level dielectric layers above the semiconductor layer that interconnect the devices into circuits. Because of its low resistance, copper has become a prime material for these wires. However, as the dimensions of the wires has decreased, defects such as voids have been found in narrow copper wires that locally increase the resistance of the copper wires and which can lead to circuit failures. Therefore there is a need for a fabrication process for copper interconnects that is less susceptible to voiding than current fabrication processes.

SUMMARY OF THE INVENTION

A first aspect of the present invention is a method of forming a conductive wire, comprising: (a) forming a dielectric layer on a substrate; (b) forming a dielectric hardmask layer on a top surface of the dielectric layer; (c) forming an electrically conductive hardmask layer on a top surface of the dielectric hardmask layer; (d) forming a trench extending from a top surface of the conductive hardmask layer, through the conductive hardmask layer, through the dielectric hardmask layer and into the dielectric layer, the trench having sidewalls and a bottom; after (d), (e) depositing a continuous liner/seed layer on the top surface of the conductive hardmask layer and the sidewalls and bottom of the trench; after (e), (f) filling the trench with a fill material; after (f), (g) removing the liner/seed layer from the top surface of conductive hardmask layer; after (g), (h) removing the fill material from the trench; (i) electroplating a metal layer onto exposed surface of the conductive hardmask layer and the liner/seed layer, the metal layer filling the trench; and (j) performing a chemical-mechanical-polish to remove the metal layer from the conductive hardmask layer and to remove the conductive hardmask layer from the dielectric hardmask layer, after the chemical mechanical polish, top surfaces of the metal layer, an edge of the liner/seed layer and the top surface of the dielectric hardmask layer are coplanar.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

A damascene process is one in which wire trenches or via openings are formed in a dielectric layer, an electrical conductor of sufficient thickness to fill the trenches is deposited on a top surface of the dielectric, and a chemical-mechanical-polish (CMP) process is performed to remove excess conductor and make the surface of the conductor co-planar with the surface of the dielectric layer to form damascene wires (or damascene vias). When only a trench and a wire (or a via opening and a via) is formed the process is called single-damascene.

A dual-damascene process is one in which via openings are formed through the entire thickness of a dielectric layer followed by formation of trenches part of the way through the dielectric layer in any given cross-sectional view. All via openings are intersected by integral wire trenches above and by a wire trench below, but not all trenches need intersect a via opening. An electrical conductor of sufficient thickness to fill the trenches and via opening is deposited on a top surface of the dielectric and a CMP process is performed to make the surface of the conductor in the trench co-planar with the surface the dielectric layer to form dual-damascene wires and dual-damascene wires having integral dual-damascene vias.

The present invention will be described using a single-damascene process, but it should be understood the present invention may be practiced using a dual-damascene process as well.

Figure 1:
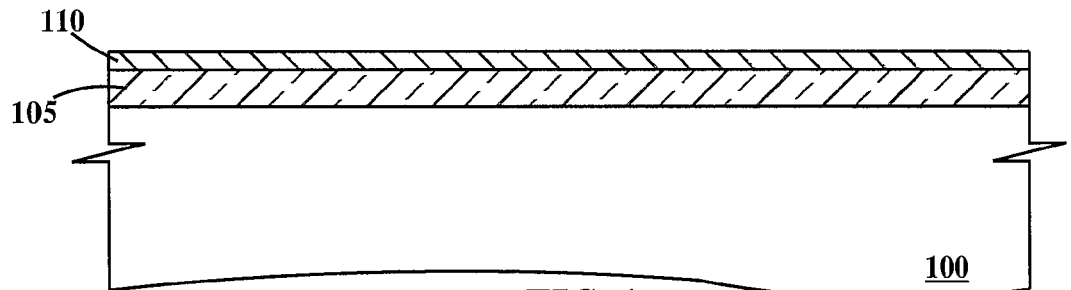
FIGS. 1 through 8 are cross-section views illustrating fabrication of an interconnect structure according to the present invention.

FIGS. 1 through 8 are cross-section views illustrating fabrication of an interconnect structure according to the present invention. In FIG. 1, formed on a top surface of a substrate 100 is a dielectric hardmask layer 105. Formed on a top surface of hardmask layer 105 is an electrically conductive hardmask layer 110. In one example, dielectric hardmask layer 105 comprises organosilicate glass (SiCOH), porous SiCOH, silicon dioxide ($SiO_2$), silicon nitride ($Si_3N_4$), silicon carbide (SiC), silicon oxy nitride (SiON), silicon oxy carbide (SiOC), plasma-enhanced silicon nitride ($PSiN_x$) or NBLok (SiC(N,H)). In one example, dielectric hardmask layer 105 is between about 5 nm and about 100 nm thick. In one example conductive hardmask layer 110 comprises tungsten (W), titanium (Ti), tantalum (Ta), titanium nitride (TiN), tantalum nitride (TaN), an electrically conductive oxide such as indium oxide ($In_2O_3$), ($SnO_2$), cadmium stannate ($Cd_2SnO_4$), zinc oxide (ZnO) or an electrically conductive doped oxide such as tin doped indium oxide ($In_2O_3$:Sn), aluminum doped zinc oxide (ZnO:Al) or fluorine doped tin oxide ($SnO_2$:F). In one example, conductive hardmask layer 110 is between about 5 nm and about 100 nm thick.

Figure 2:
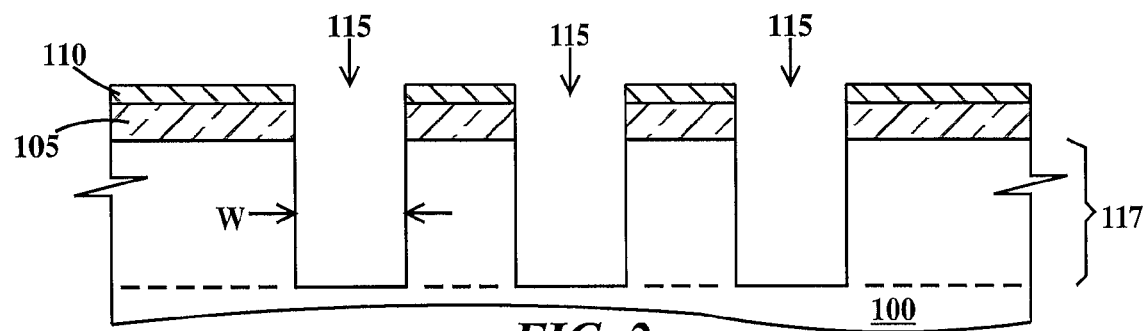

In FIG. 2, trenches 115 have been formed through dielectric hardmask 105 and conductive hardmask 110 into substrate 100. Trenches 115 have a minimum width W. In one example W is 65 µm or less. In one example, structures which are to electrically contact wires that will be formed in trenches 115 (as described infra) are exposed in the bottom of trenches 115. In one example, substrate 100 includes a dielectric layer 117, and trenches 115 extend through dielectric 117 to a metal wire or contact formed in substrate 100.

Figure 3:
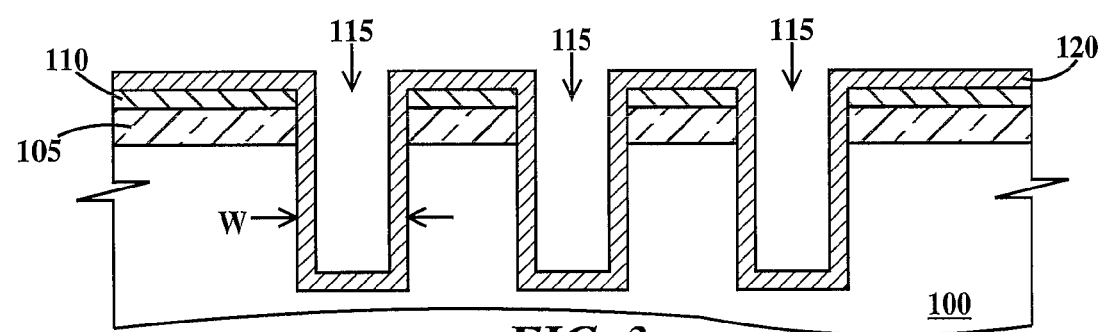

In FIG. 3, a continuous electrically conductive liner/seed layer 120 is deposited over the top surface of conductive hardmask layer 110, the sidewalls and bottom of trenches 115 and any edges of dielectric hardmask layer 105 and conductive hardmask layer 110 exposed in trenches 115. In one example, liner/seed layer 120 comprises, in order of deposition, a first layer of TaN, a second layer of Ta and a third layer of copper (Cu), ruthenium (Ru) or iridium (Ir). In one example, liner/seed layer 120 comprises, in order of deposition, a first layer of TiN, a second layer of Ti and a third layer of copper (Cu), ruthenium (Ru) or iridium (Ir). In one example, liner/seed layer 120 is between about 5 nm and about 10 nm thick. As the width W of trenches 115 decreases, liner/seed layer 120 tends to build up thicker at the top edge of the trench, narrowing the top of the trench to a width less than W. This narrowing is not shown in FIG. 3, but can cause trench fill problems when conventional copper plating processes are used to fill in trenches 115. Due to the presence of conductive hardmask layer 110, the embodiments of the present invention overcome this problem as described infra.

Figure 4:
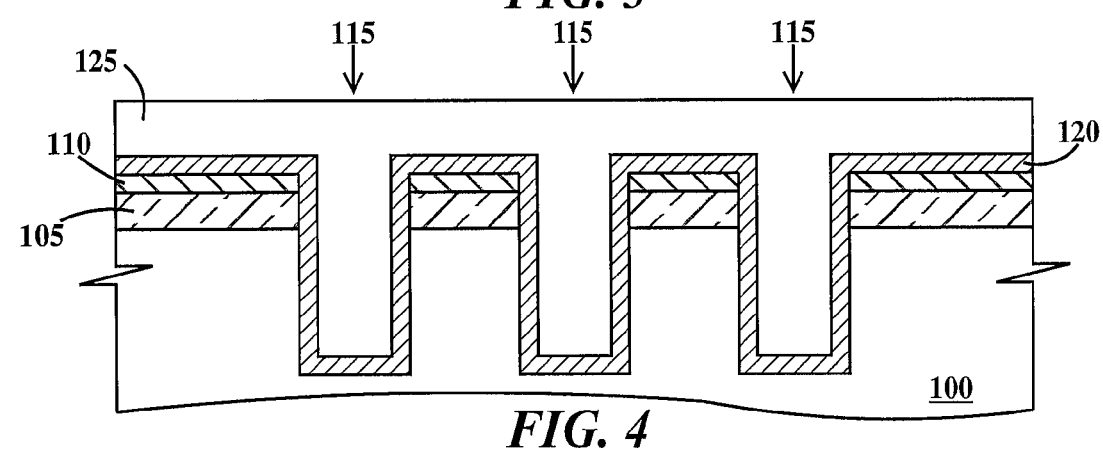

In FIG. 4, a fill layer 125 is formed on top of seed layer 120. Fill layer completely fills trenches 115. In one example, fill layer 125 comprises an organic polymer or resin or a photoresist layer. In one example, fill layer 125 is spin applied. In one example, after application, fill layer 125 may be cured by heating above room temperature or by exposure to ultraviolet radiation.

Figure 5:
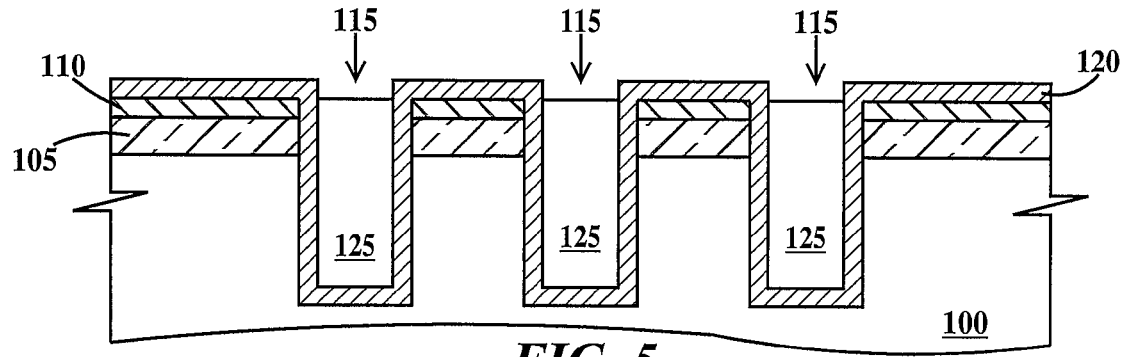

In FIG. 5, fill layer 125 is removed from the top surface of liner/seed layer 120. In one example, fill layer is removed using a reactive ion etch (RIE) processes selective to liner/seed layer 120 (i.e., etches fill layer 125 faster than liner/seed layer 120. Fill layer 125 remains in trenches 115, though it may recess below the top surface of the liner/seed layer as illustrated in FIG. 5.

Figure 6:
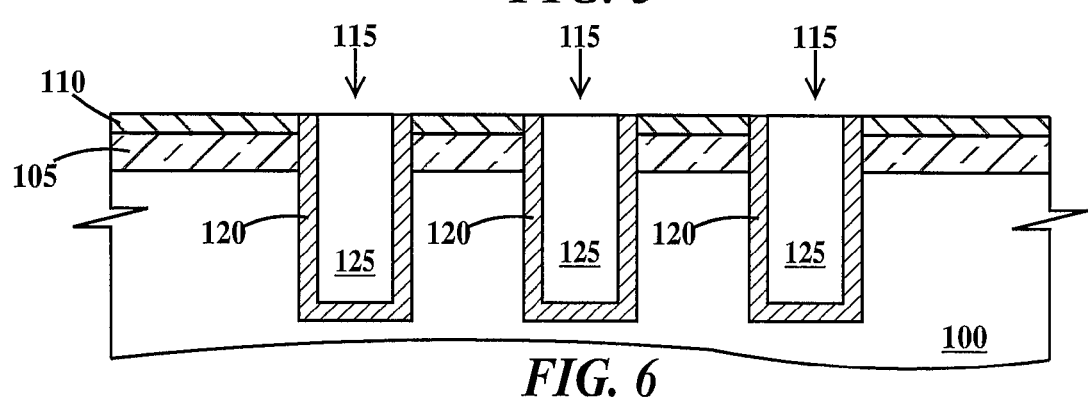
Figure 7:
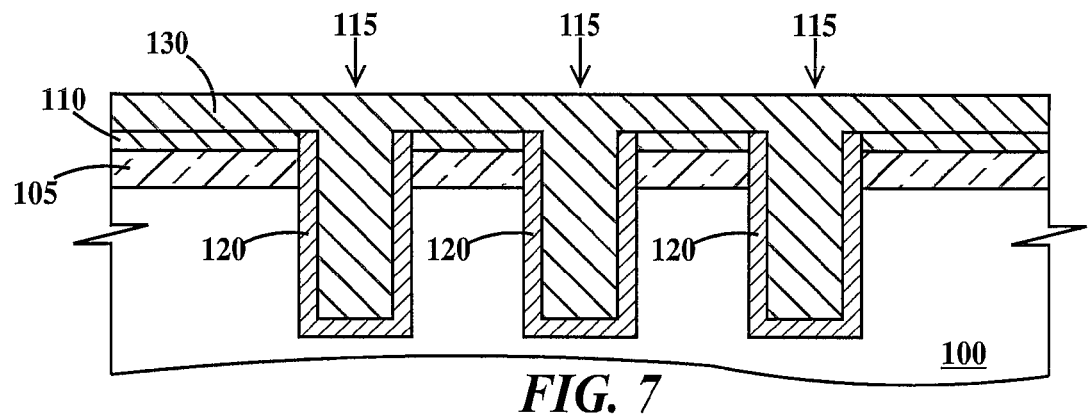

In FIG. 6, liner/seed layer 120 is removed from the top surface of conductive hardmask layer 110. In one example, liner/seed layer 120 is removed by chemical-mechanical polishing (CMP). In one example, liner/seed layer 120 is removed by RIE using a process selective to conductive hardmask layer 110. In one example, liner/seed layer 120 is removed by wet etching. In one example, liner/seed layer 120 is removed by electro-etching. In one example, liner/seed layer may 120 is removed by a combination of two or more of CMP, RIE, wet etching and electro-etching. Since any narrowing of the width of trenches 115 would have occurred by build-up of liner/seed layer 120 at the top edges of the trenches as described supra, most if not all of this excess material is removed by the CMP process. Conductive hardmask layer 110 remains for subsequent electroplating processes as described infra. Conductive hardmask layer 110 and liner/seed layer 120 are in physical and electrical contact proximate to the top of trenches 115.

Figure 6A:
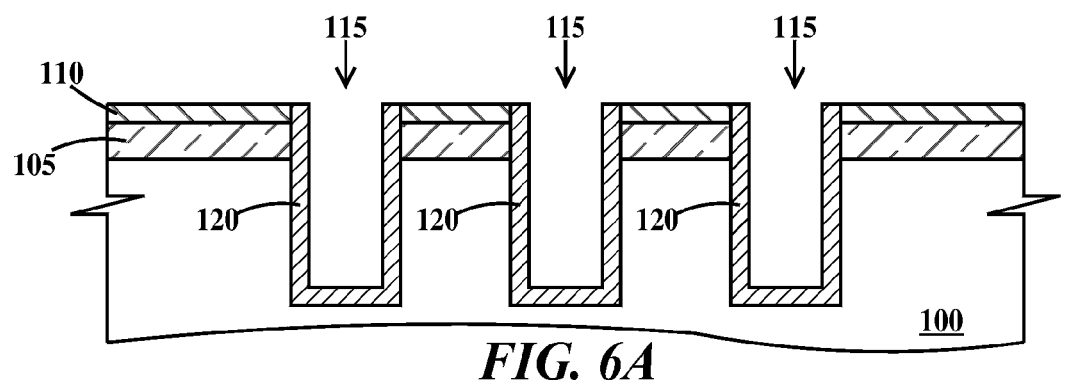

In FIG. 6A, fill layer 125 (see FIG. 6) is removed from trenches 115, exposing liner/seed layer 120 on the sidewalls and bottom of trenches 115. In one example, fill layer 125 is removed by a super critical carbon dioxide removal process. Then, in FIG. 7, an electrically conductive layer 130 (e.g., a metal or Cu) is electro-plated on to the exposed surfaces of conductive hardmask layer 110 and liner/seed layer 120. Since conductive hardmask layer 110 and liner/seed layer are in electrical contact, plating current is carried by conductive hardmask layer 110 to liner/seed layer 120 so metal is plated out of the plating solution to completely fill trenches 115.

Figure 8:
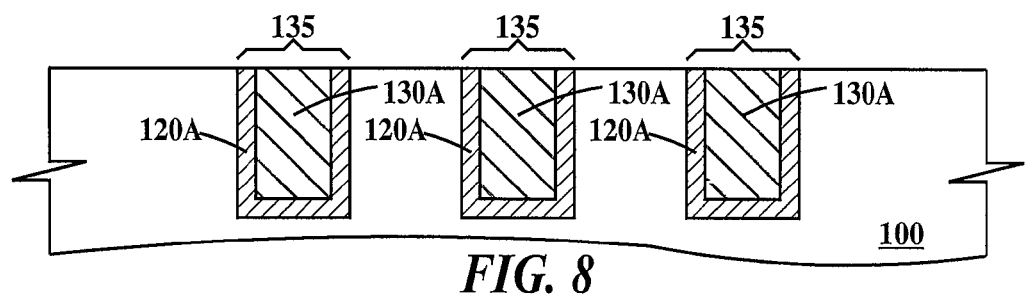
Figure 7A:
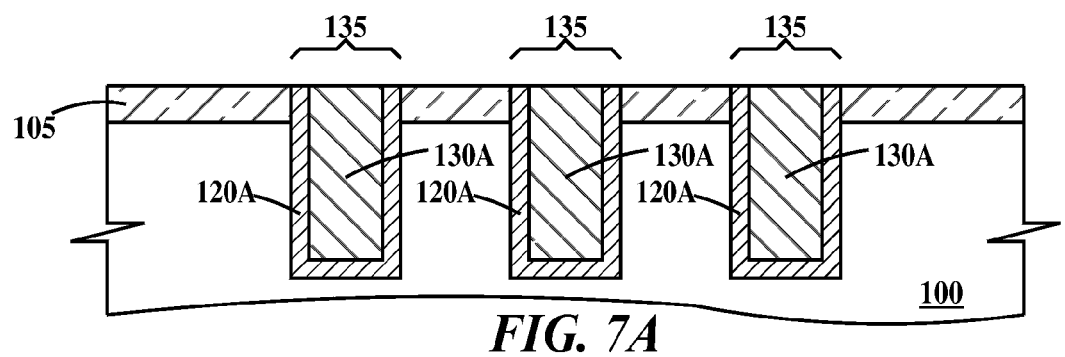

In FIG. 8, a CMP is performed to remove portions of metal layer 130 (see FIG. 7), conductive hardmask layer 110 (see FIG. 7) and dielectric hardmask layer 105 (see FIG. 7) to form wires 135 in substrate 100. Top surfaces of wires 135 are substantially coplanar with the top surface of substrate 100. Wires 135 comprise a liner 120A (formed from liner/seed layer 120) and a core conductor 130A (formed from conductive layer 130. Alternatively, in FIG. 7A, dielectric hardmask layer 105 is not removed, is which case top surfaces of wires 135 are coplanar with the top surface of dielectric hardmask layer 105.

Thus, the embodiments of the present invention provide a fabrication process for formation of copper interconnects that is less susceptible to voiding than current fabrication processes.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method of forming a conductive wire, comprising:
   (a) forming a dielectric layer on a substrate;
   (b) forming a dielectric hardmask layer on a top surface of said dielectric layer;
   (c) forming an electrically conductive hardmask layer on a top surface of said dielectric hardmask layer;
   (d) forming a trench extending from a top surface of said electrically conductive hardmask layer, through said electrically conductive hardmask layer, through said dielectric hardmask layer and into said dielectric layer, said trench having sidewalls and a bottom;
   after (d), (e) depositing a continuous electrically conductive liner/seed layer on said top surface of said electrically conductive hardmask layer and said sidewalls and bottom of said trench;
   after (e), (f) forming a layer of an organic fill material on the entire top surface of said electrically conductive liner/seed layer, said fill material completely filling said trench;
   after (f), (g) removing said layer of organic fill material from said top surface of said electrically conductive hardmask layer and recessing said organic material below said top surface of said electrically conductive hardmask layer using a reactive ion etch process selective to said electrically conductive liner/seed layer so a top surface of said organic fill material is between the top surface of said electrically conductive liner/seed layer and above said top surface of said dielectric hardmask layer;
   after (g), (h) removing said electrically conductive liner/seed layer from said top surface of said electrically conductive hardmask layer;
   after (h), (i) removing all remaining fill material from said trench, said electrically conductive liner/seed layer remaining on the entire surface of said sidewalls and said bottom of said trench;
   after (i), (j) electroplating a metal layer onto exposed surface of said electrically conductive hardmask layer and said electrically conductive liner/seed layer, said metal layer filling said trench; and
   after (j), (k) performing a chemical-mechanical-polish to remove said metal layer from said electrically conductive hardmask layer and to remove said electrically conductive hardmask layer from said dielectric hardmask layer, after said chemical mechanical polish, top surfaces of said metal layer, an edge of said electrically conductive liner/seed layer and said top surface of said dielectric hardmask layer are coplanar.

2. The method of claim 1, further including:
   between (h) and (i), performing a further chemical mechanical polish to remove said dielectric hardmask layer from said dielectric layer, after said further chemical mechanical polish, a top surface of said metal layer, an edge of said liner/seed layer and said top surface of said dielectric layer are coplanar.

3. The method of claim 1, wherein (f) includes:
   spin applying said organic fill material.

4. The method of claim 1, wherein said electrically conductive liner/seed layer comprises a first layer and a second layer deposited on said first layer.

5. The method of claim 1, wherein said dielectric hardmask layer comprises organosilicate glass, porous organosilicate glass, silicon dioxide, silicon nitride, silicon carbide, silicon oxy nitride, silicon oxy carbide, plasma-enhanced silicon nitride or (SiC(N,H)).

6. The method of claim 1, wherein said electrically conductive hardmask layer comprises tungsten, titanium, tantalum, titanium nitride, tantalum nitride an electrically conductive oxide, indium oxide, tin oxide, cadmium stannate, zinc oxide, an electrically conductive doped oxide, tin doped indium oxide, aluminum doped zinc oxide or fluorine doped tin oxide.

7. The method of claim 1, wherein said fill material comprises an organic polymer, a resin or a photoresist.

8. The method of claim 1, wherein said dielectric hardmask layer is between about is between about 5 nm and about 100 nm thick.

9. The method of claim 1, wherein said electrically conductive hardmask layer is between about 5 nm and about 100 nm thick.

10. The method of claim 1, wherein said liner/seed layer is between about 5 nm and about 20 nm thick.

11. The method of claim 1, wherein a minimum width of said trench is about 65 nm or less.

12. The method of claim 1, wherein said remaining fill material is removed from said trench using a super critical carbon dioxide process.

13. The method of claim 1, wherein said electrically conductive liner/seed layer is removed by chemical-mechanical polishing (CMP).

14. The method of claim 1, wherein said electrically conductive liner/seed layer is removed by reactive ion etching using a process selective to said electrically conductive hardmask layer.

15. The method of claim 1, wherein said electrically conductive liner/seed layer is removed by wet etching.

16. The method of claim 1, wherein said electrically conductive liner/seed layer is removed by electro-etching.

17. The method of claim 1, wherein said electrically conductive liner/seed layer is removed by a combination of two or more of chemical-mechanical polishing, reactive ion etching, wet etching and electro-etching.

18. The method of claim 3, further including:
after said spin applying, curing said organic fill layer by heating said organic fill layer to a temperature above room temperature.

19. The method of claim 4, wherein said first layer comprises titanium, tantalum, titanium nitride, tantalum nitride or layers thereof and said second layer comprises copper.

20. The method of claim 3, further including:
after said spin applying, curing said organic fill layer by exposing said organic fill layer to ultraviolet light.

* * * * *